(12) United States Patent
Mercado

(10) Patent No.: US 6,879,383 B2
(45) Date of Patent: Apr. 12, 2005

(54) LARGE-FIELD UNIT-MAGNIFICATION PROJECTION SYSTEM

(75) Inventor: Romeo I. Mercado, Fremont, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 10/330,567

(22) Filed: Dec. 27, 2002

(65) Prior Publication Data

US 2004/0125352 A1 Jul. 1, 2004

(51) Int. Cl.⁷ .......................... G03B 27/54; G03B 27/42
(52) U.S. Cl. .......................................... 355/67; 355/53
(58) Field of Search .............................. 355/43, 53, 55, 355/67; 359/650, 727

(56) References Cited

U.S. PATENT DOCUMENTS

| | | | |
|---|---|---|---|
| 4,103,989 A | 8/1978 | Rosin | 350/199 |
| 4,171,870 A | 10/1979 | Bruning et al. | 350/173 |
| 4,171,871 A * | 10/1979 | Dill et al. | 359/730 |
| 4,391,494 A * | 7/1983 | Hershel | 359/727 |
| 4,425,037 A | 1/1984 | Hershel et al. | 355/43 |
| 4,469,414 A * | 9/1984 | Shafer | 359/365 |
| 4,964,705 A | 10/1990 | Markle | 350/442 |
| 5,031,977 A | 7/1991 | Gibson | 350/1.4 |
| 5,040,882 A | 8/1991 | Markle | 359/727 |
| 5,161,062 A | 11/1992 | Shafer et al. | 359/785 |
| 5,559,629 A | 9/1996 | Sheets et al. | 359/364 |
| 5,805,356 A | 9/1998 | Chiba | 359/727 |

\* cited by examiner

*Primary Examiner*—Henry Hung Nguyen
(74) *Attorney, Agent, or Firm*—Allston L. Jones

(57) ABSTRACT

An optical system for projection photolithography is disclosed. The optical system is a modified Dyson system capable of imaging a large field over a broad spectral range. The optical system includes a positive lens group having three elements: a plano-convex element and two negative meniscus elements. The lens group is arranged adjacent to but spaced apart from a concave mirror along the mirror axis. A projection photolithography system that employs the optical system is also disclosed.

21 Claims, 4 Drawing Sheets

LARGE-FIELD UNIT-MAGNIFICATION PROJECTION SYSTEM

BACKGROUND OF THE INVENTION

1. Field of the Invention

The present invention relates to optical projection systems, and in particular to a large-field unit-magnification projection optical system.

2. Description of the Prior Art

Photolithography is presently employed not only in sub-micron resolution integrated circuit (IC) manufacturing, but also to an increasing degree in gold-bumping and other wafer-level IC packaging technologies that require relatively low (i.e., a few microns) resolution, a large depth of focus, and a high throughput. Accordingly, there is an increasing demand for relatively low-resolution in high throughput projection photolithography systems.

The present invention described in the "Detailed Description of the Invention" section below, is related to the optical system described in U.S. Pat. No. 4,391,494 (hereinafter, "the '494 patent") issued on Jul. 5, 1983 to Ronald S. Hershel and assigned to General Signal Corporation.

FIG. 1 is a cross-sectional diagram of an example optical system 8 according to the '494 patent. The optical system described in the '494 patent and illustrated in FIG. 1 here is a unit-magnification, catadioptric, achromatic and anastigmatic, optical projection system that uses both reflective and refractive elements in a complementary fashion to achieve large field sizes and high numerical apertures. The system is basically symmetrical relative to an aperture stop located at the mirror, thus eliminating odd order aberrations such as coma, distortion and lateral color. All of the spherical surfaces are nearly concentric, with the centers of curvature located close to where the focal plane would be located were the system not folded. Thus, the resultant system is essentially independent of the index of refraction of the air in the lens, making pressure compensation unnecessary.

Optical system 8 includes a concave spherical mirror 10, an aperture stop AS1 located at the mirror, and a composite, achromatic plano-convex doublet lens-prism assembly 12. Mirror 10 and assembly 12 are disposed symmetrically about an optical axis 14. Optical system 8 is essentially symmetrical relative to an aperture stop AS1 located at mirror 10 so that the system is initially corrected for coma, distortion, and lateral color. All of the spherical surfaces in optical system 8 are nearly concentric.

In optical system 8, doublet-prism assembly 12, which includes a meniscus lens 13A, a plano-convex lens 13B and symmetric fold prisms 15A and 15B, in conjunction with mirror 10, corrects the remaining optical aberrations, which include axial color, astigmatism, petzval, and spherical aberration. However, for large-field (i.e., greater than 50 mm×100 mm), broad-spectral-band applications (i.e., for the g, h, i, spectral lines of mercury—436 nm, 405 nm, 365 nm, respectively) and moderately high numerical apertures (e.g., $NA \geq 0.15$), optical system 8 cannot produce a sufficiently high-quality image.

Symmetric fold prisms 15A and 15B are used to attain sufficient working space for movement of a reticle 16 and a wafer 18. Optical system 8 includes an object plane OP1 and an image plane IP1, which are separated via folding prisms 15A and 15B. The cost of this gain in working space is the reduction of available field size to about 25% to 35% of the total potential field. In the past, this reduction in field size has not been critical since it has been possible to obtain both acceptable field size and the degree of resolution required for the state-of-the-art circuits.

However, with the increasing demand for larger field sizes, other designs for optical systems capable of supporting larger field sizes and large depth of focus while maintaining resolution and correction over a wide spectral bandwidth are needed.

SUMMARY OF THE INVENTION

A first aspect of the invention is an optical system that includes, along an optical axis, a concave spherical mirror and a lens group. The lens group has positive refractive power and is arranged adjacent the mirror with an airspace therebetween. The lens group includes, in order towards the mirror, a plano-convex lens element having a convex surface facing the mirror, and first and second negative meniscus lens elements arranged adjacent the plano-convex lens with their convex surfaces facing the mirror. The optical system further includes first and second prisms each having respective first and second flat surfaces. The second flat surfaces are arranged adjacent the flat surface of the plano-convex lens element on opposite sides of the optical axis. The first flat surfaces are arranged adjacent object and image planes, respectively. Each element in the lens group is formed from a different glass type such that the lens group and first and second prisms provide chromatic aberration correction at g, h and i-line wavelengths, and over a square field size of about 61.5 mm×61.5 mm or greater, or over a rectangular field size of about 50 mm×100 mm or greater, and at numerical aperture of 0.15 or greater.

A second aspect of the invention is a photolithography projection system that includes the projection optical system of the present invention.

Figure 1:
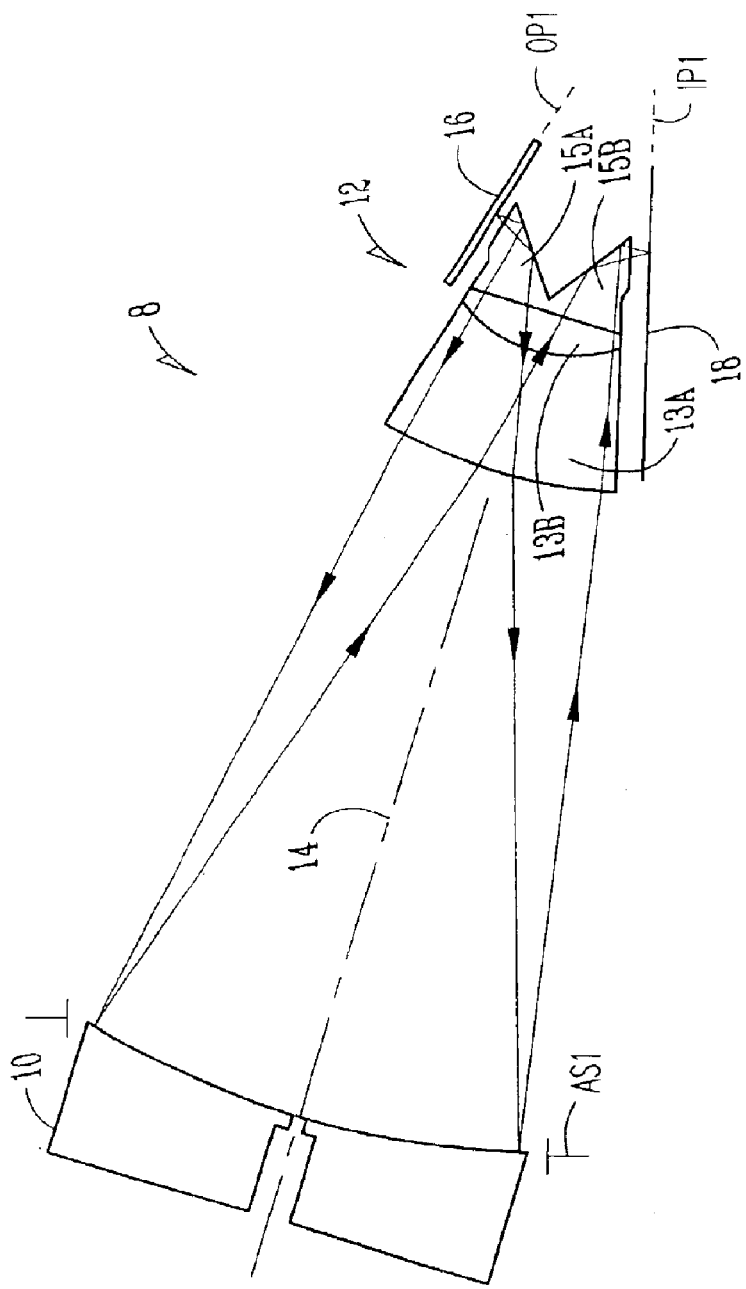
FIG. 1 is a cross-sectional diagram of an example prior art unit-magnification projection optical system according to the '494 patent.

The various elements depicted in the drawings are merely representational and are not necessarily drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

The present invention is a large-field, broad-spectral-band, color-corrected, anastigmatic, projection optical system that projects an image of a pattern formed on a reticle onto a substrate (wafer) at substantially unit magnification. The unit-magnification projection optical system of the present invention is an improvement from the prior art optical system 8 of the '494 patent, described briefly above and illustrated in FIG. 1, and performs a different function.

As used herein, the term "large field" means a field having a rectangular dimension of about 50 mm×100 mm or greater or a square field of 61.5 mm×61.5 mm or greater. Also, the term "broad spectral band" refers a spectral band that includes the g, h, i, spectral lines of mercury (i.e., 436 nm, 405 nm, 365 nm, respectively).

The projection optical system of the present invention as described in detail below has very good image quality (i.e., polychromatic Strehl ratios greater than 0.95) over a large field, and over a broad wavelength spectrum. This makes optical system 100 particularly useful for wafer-level IC packaging applications, such as bump lithography and the like, that do not require the highest levels of resolution, e.g., such as the resolution needed to print minimum linewidths for state-of-the-art integrated circuits.

Figure 2:
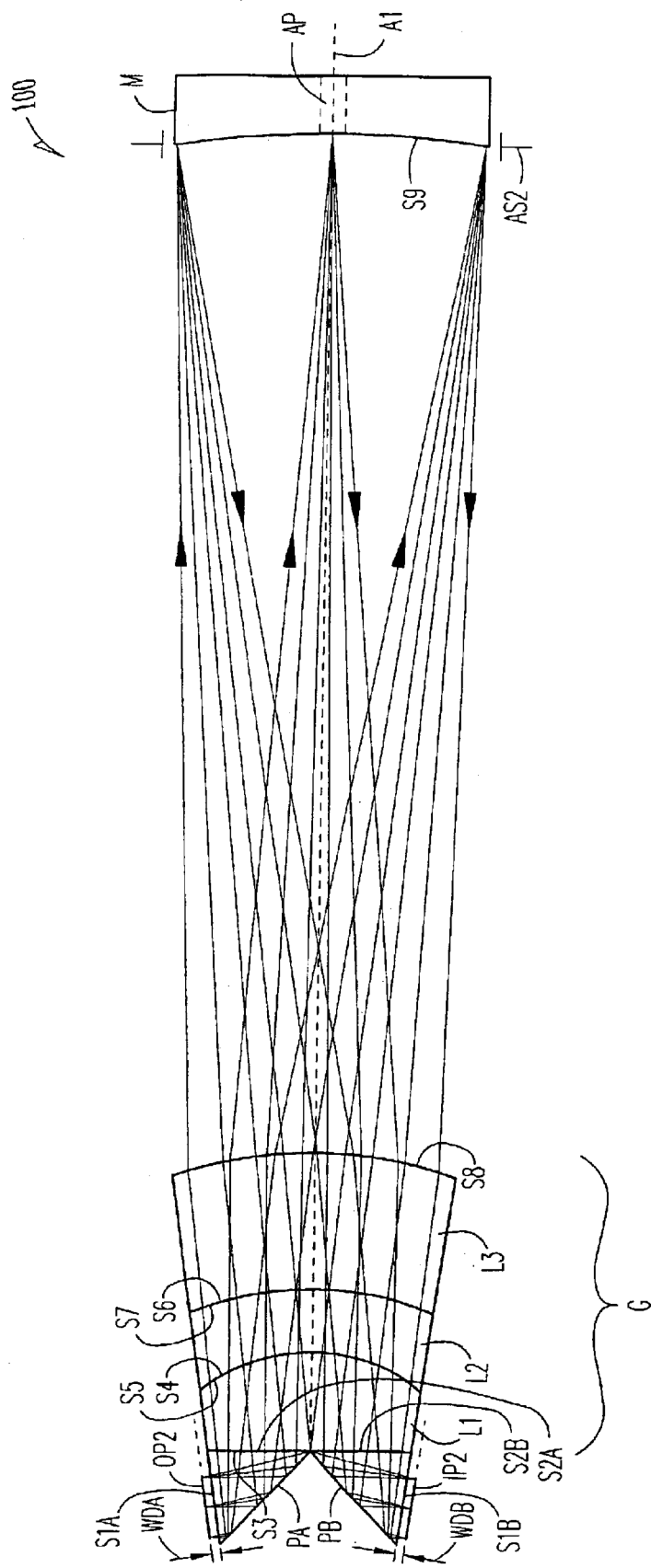
FIG. 2 is cross-sectional diagram of a first example embodiment of the unit-magnification projection optical system of the present invention.
Figure 3:
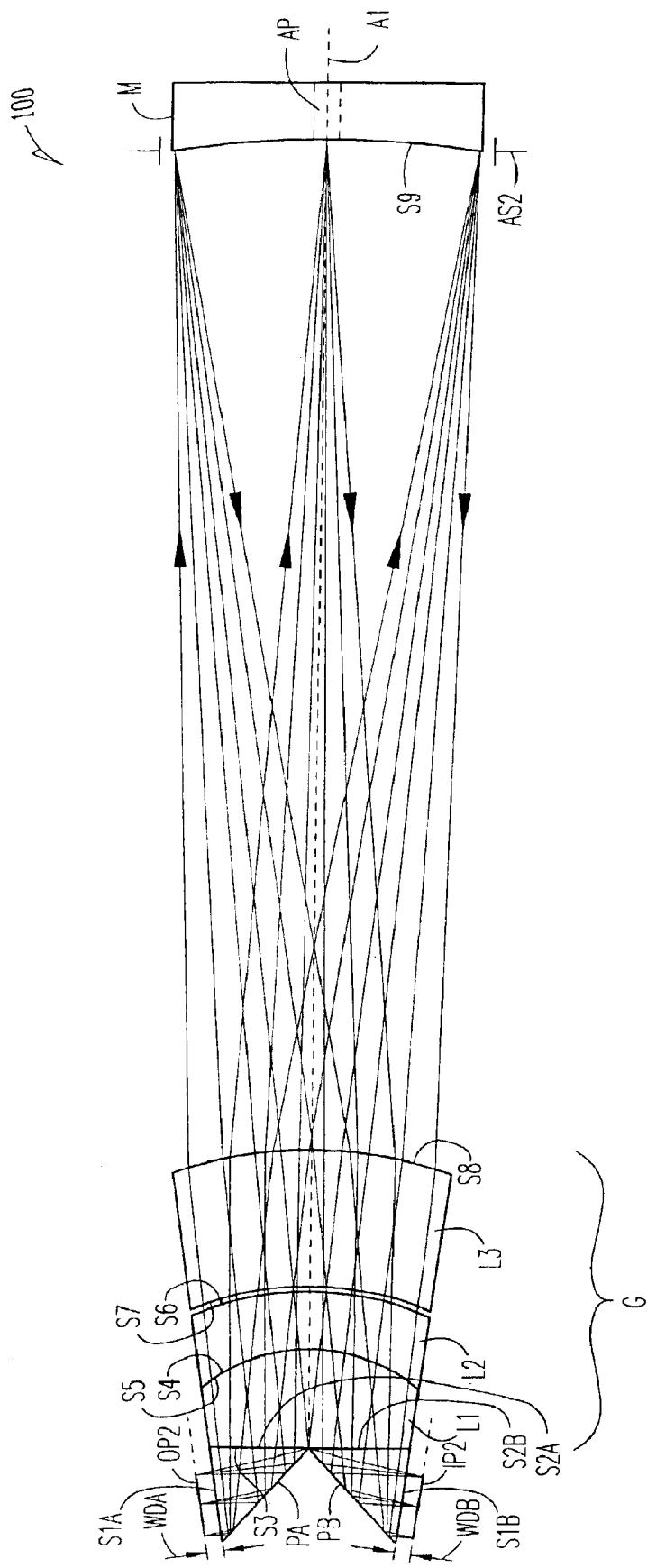
FIG. 3 is cross-sectional diagram of a second example embodiment of the unit-magnification projection optical system of the present invention.

FIGS. 2 and 3 are diagrams of example embodiments of the unit-magnification projection optical system 100 of the present invention. Projection optical system 100 includes, along an axis A1, a concave spherical mirror M with an associated aperture stop AS2. In an example embodiment, mirror M includes an aperture AP on the optical axis. Aperture AP may be used, for example, to introduce light into the optical system for performing functions other than direct imaging with optical system 100, such as for aligning of an object (e.g., a mask) with its image, or inspecting the object.

Optical system 100 further includes a field corrector lens group G with positive refractive power arranged along axis A1 adjacent to and spaced apart from mirror M. In an example embodiment, lens group G includes a positive lens element L1 with surfaces S3 and S4. In an example embodiment, positive lens L1 is plano-convex with surface S4 being convex and surface S3 being flat.

Further in an example embodiment, lens group G includes adjacent lens element L1 and towards mirror M at least two negative lens elements L2 and L3. Lens L2 has surfaces S5 and S6 and Lens L3 has surfaces S7 and S8. Further in an example embodiment, negative lenses L2 and L3 are meniscus type, with S6 and S8 being convex. In one example embodiment, lens group G consists of lens elements L1, L2 and L3 only.

Adjacent lens group G is a first prism PA with surfaces S1A and S2A, and a second prism PB with surfaces S1B and S2B. Surface S1A faces an object plane OP2 and surface S1B faces an image plane IP2. Object plane OP2 and image plane IP2 are spaced apart from respective flat surfaces S1A and S1B by respective gaps WDA and WDB representing working distances. In example embodiments where there is complete symmetry with respect to aperture stop AS2, WDA=WDB. Since WDA and WDB are equal to each other, in the accompanying Tables 1–5 those distances are referred to as WD.

Although prisms PA and PB are not included in field corrector lens group G, these prisms play a role in the aberration correction, including chromatic aberration correction.

Further Example Embodiments

Further example embodiments of projection optical system 100 are provided in Tables 1 through 5. Because of the symmetry of optical system 100, the specifications set forth in Tables 1 through 5 only include values from object plane OP2 to concave mirror M. In Tables 1 through 5, a positive radius indicates the center of curvature to the right of the surface and negative radius indicates the center of curvature to the left. The thickness of an element, or the separation between elements, is the axial distance to the next surface, and all dimensions are in millimeters. Further, "S#" stands for surface number, "T or S" stands for "thickness or separation," and "STOP" stands for aperture stop AS2.

Further, under the heading "surface shape," an aspheric surface is denoted by "ASP" a flat surface by "FLT" and a spherical surface by "SPH."

The aspheric equation describing an aspherical surface is given by:

$$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

wherein "CURV" is the spherical curvature of the surface, K is the conic constant, and A, B, C and D are the aspheric coefficients. In the accompanying Tables 1–5, "E" denotes exponential notation (powers of 10).

The main design improvements of optical system 100 over the prior art optical system of the '494 patent include the addition of a meniscus lens element L3, the use of at least one aspherical surface in lens group G, and appropriately selecting the optical glass types for the field corrector lenses (i.e., lenses L1, L2 and L3) and prisms to correct the field aberrations (particularly astigmatism), spherical aberration, petzval curvature, axial color and chromatic variations of these aberrations at large field sizes and over a broad spectral range.

In an example embodiment, providing a small air space between the meniscus lens elements L2 and L3, as illustrated in FIG. 3, further reduces the residual aberrations, particularly the chromatic variations, and shortens the overall length of optical system 100, while maintaining high-quality imaging performance over a wide field and broad band spectrum.

All the above example embodiments essentially preserve the system symmetry relative to aperture stop AS2, which inherently eliminates the odd-order aberrations such as coma, distortion, and lateral color. Optical system 100 includes no concentric lens elements in lens group G or lens surfaces that are concentric with the concave spherical mirror M.

In an example embodiment, lens elements L1, L2 and L3 are each formed of a different glass type than the others, that in conjunction with the first and second prisms, collectively corrects the chromatic aberrations across a broad spectral band that includes the g, h and i lines.

In another example embodiment, lens elements L1, L2 and L3 have spherical surfaces, as illustrated in the design set forth in Table 1.

In a further example embodiment, one of elements L2 and L3 has an aspherical surface, as illustrated in the designs set forth in Tables 2–5.

In another example embodiment, adjacent surfaces of lens elements L1, L2 and L3 are in contact or are optically brought together with a cement or gel, as illustrated in FIG. 2.

In yet another example embodiment, at least one surface of lens elements L1, L2 and L3 is closely air-spaced with an adjacent lens element surface, such as illustrated in FIG. 3, wherein the air-space is between lens elements L2 and L3.

In another example embodiment, first and second prisms PA and PB are formed with glass type 603606, such as Ohara BSM51Y. Further in the example embodiment, plano-convex lens L1 is formed with glass type 458678, such as fused silica or silica glass, and the meniscus lens elements L2 and L3 formed from the glass type 581408, such as Ohara PBL25Y, and glass type 532490, such as Ohara PBL6Y.

In another example embodiment, lens L3 includes an aspherical surface on convex surface S8, as illustrated in the design set forth in Table 2. In a related example embodiment, lens L3 includes an aspherical surface on concave surface S7, as illustrated in Table 4.

In another example embodiment, lens L2 has an aspherical surface on surface S6, as illustrated in the design set forth in Table 3. In yet another related example embodiment, lens element L1 includes an aspherical surface.

In further example embodiment, optical system 100 has a field size of between 50 mm×100 mm and 52.5 mm×100 mm, inclusive.

In yet another example embodiment, optical system 100 has a numerical aperture between 0.16 and 0.20, inclusive.

Photolithography System

Figure 4:
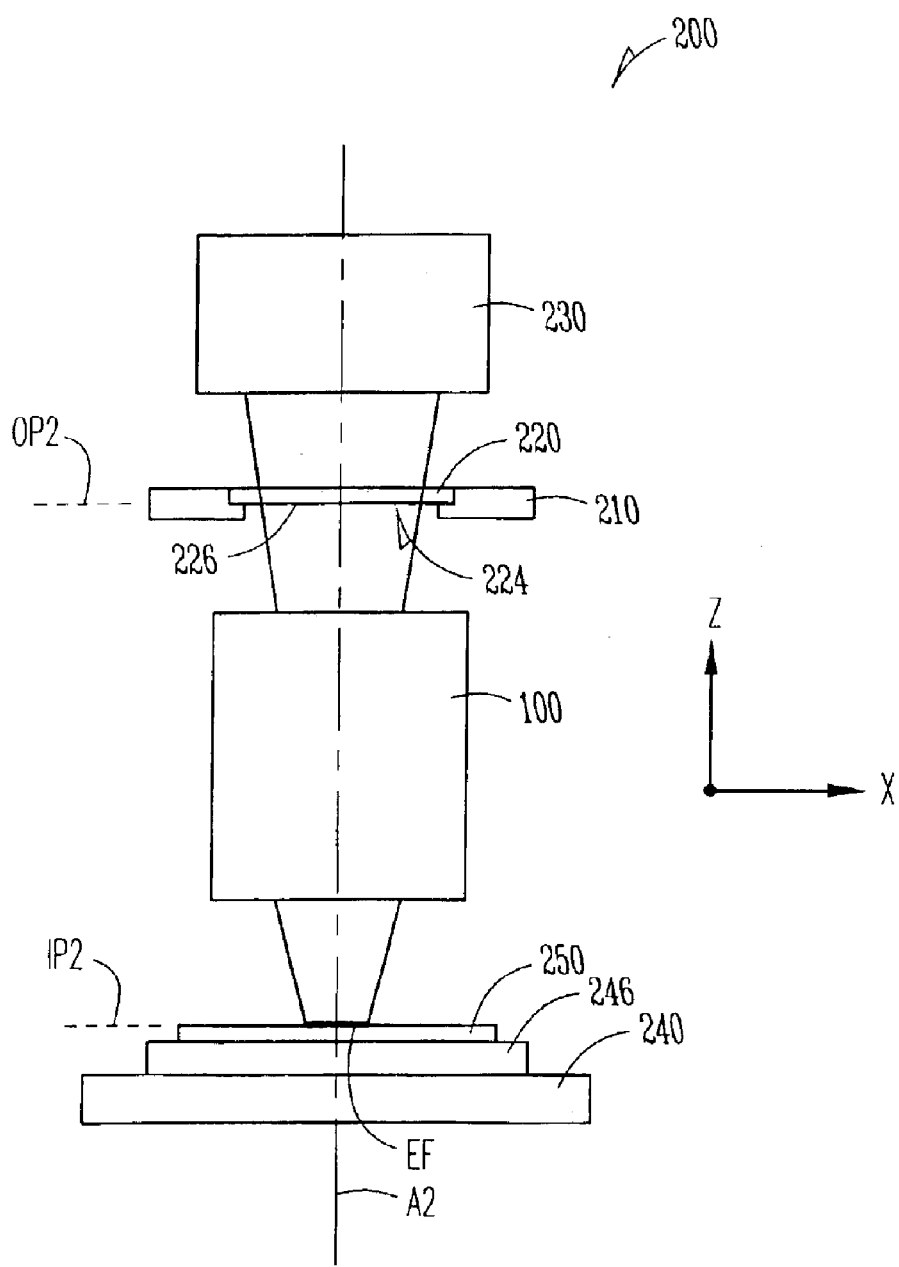
FIG. 4 is a schematic diagram of a photolithography system employing the unit-magnification projection optical system of the present invention.

FIG. 4 is a schematic diagram of a photolithography system 200 employing the unit-magnification projection optical system 100 of the present invention. System 200 has an optical axis A2 and includes a mask stage 210 adapted to support a mask 220 at object plane OP2. Mask 220 has a pattern 224 formed on a mask surface 226. An illuminator 230 is arranged adjacent mask stage 210 opposite optical system 100 and is adapted to illuminate mask 220.

System 200 also includes a wafer stage 240 adapted to movably support a wafer 246 at image plane IP2. In an example embodiment, wafer 246 is coated with a photosensitive layer 250 that is activated by one or more wavelengths of radiation from the illuminator. Such radiation is referred to in the art as "actinic radiation." In an example embodiment, the one or more wavelengths of radiation include the mercury g, h and i lines.

In operation, illuminator 230 illuminates mask 220 so that pattern 224 is imaged at wafer 246 by optical system 100, thereby forming a pattern in photoresist layer 250. The result is an exposure field EF that occupies a portion of the wafer. Wafer stage 240 then moves ("steps") wafer 246 in a given direction (e.g., the x-direction) by a given increment (e.g., the size of one exposure field EF), and the exposure process is repeated. This step-and-expose process is repeated (hence the name "step-and-repeat") until a desired number of exposure fields EF are formed on wafer 246.

The wafer is then removed from system 200 (e.g., using a wafer handling system, not shown) and processed (e.g., developed, baked, etched, etc.) to transfer the pattern formed in the photoresist in each exposure field EF to the wafer. Repeating this photolithography process with different masks allows for three-dimensional structures to be formed in the wafer to create operational devices, such as ICs.

Additional Embodiments of the Present Invention

A. A first additional embodiment of the invention is an optical system including, along an optical axis, a concave spherical mirror, a lens group with positive refracting power arranged adjacent the mirror with an airspace therebetween, the lens group includes in order towards the mirror: a plano-convex lens element having a convex surface facing the mirror and a flat surface facing away from the mirror and first and second negative meniscus lens elements arranged adjacent the plano-convex lens and having respective convex surfaces facing the mirror. This optical system also including first and second prisms each having respective first and second flat surfaces, wherein the second flat surfaces are arranged adjacent the flat surface of the plano-convex lens element on opposite sides of the optical axis, and wherein the first flat surfaces are arranged adjacent object and image planes, respectively, and wherein each lens element in the lens group is formed from a different glass type such that the lens group and first and second prisms provide chromatic aberration correction at g, h and i-line wavelengths.

B. A second additional embodiment of the invention is the optical system of A. above that also includes at least one of a square field having a size of at least 61.5 mm×61.5 mm, and a rectangular field having a size of at least 50 mm×100 mm with a numerical aperture of 0.15 or greater.

C. A third additional embodiment of the invention is the optical system of A. above that also includes a field size of between 50 mm×100 mm and 52.5 mm×100 mm, inclusive.

D. A fourth additional embodiment of the invention is the optical system of A. above that has a numerical aperture of between 0.16 and 0.20, inclusive.

E. A fifth additional embodiment of the invention is the optical system of A. above wherein the lens elements in the lens group are spherical.

F. A sixth additional embodiment of the invention is the optical system of A. above in which at least one lens element in the lens group includes an aspherical surface.

G. A seventh additional embodiment of the invention is the optical system of A. above in which adjacent surfaces of lens elements in the lens group are in contact.

H. An eighth additional embodiment of the invention is the optical system of A. above in which at least one surface of the lens elements in the lens group is closely air-spaced with an adjacent lens element.

I. A ninth additional embodiment of the invention is the optical system of A. above wherein the first and second prisms are formed with glass type 603606.

J. A tenth additional embodiment of the invention is the optical system of I. above wherein the glass type further includes Ohara BSM51Y.

K. An eleventh additional embodiment of the invention is the optical system of F. above wherein the plano-convex lens is formed from one of fused silica and silica glass.

L. A twelfth additional embodiment of the invention is the optical system of H. above wherein the plano-convex lens is formed from glass type 458678.

M. A thirteenth additional embodiment of the invention is the optical system of H. above wherein the first and second meniscus lens elements are respectively formed from glass type 581408 and glass type 532490.

N. A fourteenth additional embodiment of the invention is the optical system of H. above wherein the first and second meniscus lens elements are respectively formed from glass type Ohara PBL25Y and glass type Ohara PBL6Y.

O. A fifteenth additional embodiment of the invention is the optical system of A. above wherein the first and second prisms are formed with glass type 603606, the plano-convex lens is formed with glass type 458678, and the first and second meniscus lens elements are respectively formed with glass types 581408 and 532490.

P. A sixteenth additional embodiment of the invention is the optical system of A. above wherein the convex surface of the second meniscus lens element is aspherical.

Q. A seventeenth additional embodiment of the invention is the optical system of A. above wherein the convex surface of the first meniscus lens element is aspherical.

R. An eighteenth additional embodiment of the invention is the optical system of A. above wherein the first meniscus lens has an aspherical concave surface.

S. A nineteenth additional embodiment of the invention is the optical system of A. above wherein the mirror includes an aperture formed along the optical axis.

T. A twentieth additional embodiment of the invention is a projection lithography system that includes an optical system, a mask stage capable of supporting a mask at the object plane, an illuminator adapted to illuminate the mask with at least one of the g-line, h-line and i-line wavelengths, and a wafer stage capable of movably supporting a wafer at the image plane. The optical system of this embodiment includes a concave spherical mirror, a lens group with positive refracting power arranged adjacent the mirror with an airspace therebetween with the lens group, in order towards the mirror, having a plano-convex lens element with a convex surface facing the mirror and a flat surface facing away from the mirror, and first and second negative meniscus lens elements arranged adjacent the plano-convex lens with respective convex surfaces facing the mirror. The optical system further includes first and second prisms each having respective first and second flat surfaces with the second flat surfaces arranged adjacent the flat surface of the plano-convex lens element on opposite sides of the optical axis, and with the first flat surfaces arranged adjacent object and image planes, respectively. Additionally, each lens element in the lens group is formed from a different glass type such that the lens group and first and second prisms provide chromatic aberration correction at g, h and i-line wavelengths.

U. A twenty-first additional embodiment of the invention is the projection lithography system of T. above that further includes at least one of a square field having a size of 61.5 mm×61.5 mm or greater and a rectangular field having a size of 50 mm×100 mm or greater, plus a numerical aperture 0.15 or greater.

V. A twenty-second additional embodiment of the invention is the projection lithography system of T. above that further includes a field having a size of between 50 mm×100 mm and. 52.5 mm×100 mm, inclusive.

W. A twenty-third additional embodiment of the invention is the projection lithography system of T. above that further includes a numerical aperture of between 0.16 and 0.20, inclusive.

In the foregoing Detailed Description, various features were grouped together in various embodiments. These embodiments are not to be interpreted as reflecting an intention that the claimed embodiments of the invention require more features than are expressly recited in each claim. Rather, as the following claims reflect, inventive subject matter lies in less than all features of some of the disclosed embodiments.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

TABLE 1

| Numerical Aperture | Field Height | Design Wavelengths |
|---|---|---|
| 0.15 | 78 mm | 436 nm, 405 nm, 365 nm |

| S# | RADIUS | SHAPE | T or S | MATERIAL | ELEMENT DESCRIPTION |
|---|---|---|---|---|---|
| 0 | INF | FLT | 0.0000 | | |
|   |     |     | 7.5508 | | Working distance WD |
| 1 | INF | FLT | 80.0000 | BSM51Y Ohara | Prism A/ Prism B glass path |
| 2 | INF | FLT | 0.0000 | | |
| 3 | INF | FLT | 72.0000 | Fused Silica | L1 |
| 4 | −152.349 CX | SPH | 0.0000 | | |
| 5 | −152.349 CC | SPH | 65.0000 | PBL25Y Ohara | L2 |
| 6 | −191.736 CX | SPH | 0.0000 | | |
| 7 | −191.736 CC | SPH | 103.0000 | PBL6Y Ohara | L3 |
| 8 | −324.105 CX | SPH | 872.4649 | | |
| 9 | −1197.321 CC | SPH | | REFL (STOP) | Mirror M |

TABLE 2

| Numerical Aperture | Field Height | Design Wavelengths |
|---|---|---|
| 0.16 | 78 mm | 460 nm, 436 nm, 405 nm, 365 nm, 360 nm |

| S# | RADIUS | SHAPE | S or T | MATERIAL | ELEMENT DESCRIPTION |
|---|---|---|---|---|---|
| 0 | INF | FLT | 0.0000 | | |
|   |     |     | 8.0449 | | Working distance WD |
| 1 | INF | FLT | 80.0000 | BSM51Y Ohara | Prism A/ Prism B glass path |
| 2 | INF | FLT | 0.0000 | | |
| 3 | INF | FLT | 86.0000 | Fused Silica | L1 |
| 4 | −151.476 CX | SPH | 0.0000 | | |
| 5 | −151.476 CC | SPH | 59.0000 | PBL25Y Ohara | L2 |
| 6 | −190.085 CX | SPH | 0.0000 | | |
| 7 | −190.085 CC | SPH | 103.0000 | PBL6Y Ohara | L3 |
| 8 | −324.105 | ASP | 863.9558 | | |
| 9 | −1200.860 CC | SPH | | REFL (STOP) | Mirror M |

| S8 | CURV | K | A (E-11) | B (E-15) | C (E-19) | D (E-24) |
|---|---|---|---|---|---|---|
| ASP | −0.00308542 | 0 | 3.94037 | −2.15548 | 1.64911 | −3.82874 |

TABLE 3

| | Numerical Aperture | | Field Height | | Design Wavelengths | |
|---|---|---|---|---|---|---|
| | 0.16 | | 80 mm | | 460 nm, 436 nm, 405 nm, 365 nm, 360 nm | |

| | SURFACE DESCRIPTION | | | | ELEMENT DESCRIPTION |
|---|---|---|---|---|---|
| S# | RADIUS | SHAPE | T or S | MATERIAL | |
| 0 | INF | FLT | 0.0000 | | |
| | | | 10.8465 | | Working distance WD |
| 1 | INF | FLT | 80.0000 | BSM51Y Ohara | Prism A/ Prism B glass path |
| 2 | INF | FLT | 0.0000 | | |
| 3 | INF | FLT | 72.5000 | Fused Silica | L1 |
| 4 | −162.620 CX | SPH | 0.0000 | | |
| 5 | −162.620 CC | SPH | 58.0000 | PBL25Y Ohara | L2 |
| 6 | −256.821 | ASP | 3.0000 | | |
| 7 | −243.113 CC | SPH | 99.0000 | PBL6Y Ohara | L3 |
| 8 | −293.337 CX | SPH | 826.6540 | | |
| 9 | −1155.917 CC | SPH | | REFL (STOP) | Mirror M |

| S6 ASP | CURV −0.00389376 | K 0 | A (E-10) 3.75598 | B (E-16) 4.73168 | C (E-19) 3.85739 | D (E-24) −5.12132 |
|---|---|---|---|---|---|---|

TABLE 4

| | Numerical Aperture | | Field Height | | Design Wavelengths | |
|---|---|---|---|---|---|---|
| | 0.16 | | 80 mm | | 460 nm, 436 nm, 405 nm, 365 nm, 360 nm | |

| | SURFACE DESCRIPTION | | | | ELEMENT DESCRIPTION |
|---|---|---|---|---|---|
| S# | RADIUS | SHAPE | T or S | MATERIAL | |
| 0 | INF | FLT | 0.0000 | | |
| | | | 11.8723 | | Working distance WD |
| 1 | INF | FLT | 80.0000 | BSM51Y Ohara | Prism A/ Prism B glass path |
| 2 | INF | FLT | 0.0000 | | |
| 3 | INF | FLT | 64.0000 | Fused Silica | L1 |
| 4 | −168.045 CX | SPH | 0.0000 | | |
| 5 | −168.045 CC | SPH | 25.0000 | PBL25Y Ohara | L2 |
| 6 | −257.679 CX | SPH | 3.7677 | | |
| 7 | −244.388 | ASP | 136.0000 | PBL6Y Ohara | L3 |
| 8 | −296.612 CX | SPH | 829.3589 | | |
| 9 | −1155.593 CC | SPH | | REFL (STOP) | Mirror M |

| S7 ASP | CURV −0.00409185 | K 0 | A (E-10) −8.00608 | B (E-15) −6.57538 | C (E-19) −6.09077 | D (E-24) 2.07002 |
|---|---|---|---|---|---|---|

TABLE 5

| | Numerical Aperture | | Field Height | | Design Wavelengths | |
|---|---|---|---|---|---|---|
| | 0.20 | | 79 mm | | 436 nm, 405 nm, 365 nm | |

| | SURFACE DESCRIPTION | | | | ELEMENT DESCRIPTION |
|---|---|---|---|---|---|
| S# | RADIUS | SHAPE | T or S | MATERIAL | |
| 0 | INF | FLT | 0.0000 | | |
| | | | 10.4312 | | Working distance WD |
| 1 | INF | FLT | 80.0000 | BSM51Y Ohara | Prism A/ Prism B glass path |
| 2 | INF | FLT | 0.0000 | | |
| 3 | INF | FLT | 55.0000 | Fused Silica | L1 |
| 4 | −163.285 CX | SPH | 0.0000 | | |
| 5 | −163.285 CC | SPH | 32.0000 | PBL25Y Ohara | L2 |
| 6 | −253.465 | ASP | 3.5132 | | |
| 7 | −244.388 CC | SPH | 139.0000 | PBL6Y Ohara | L3 |
| 8 | −300.011 CX | SPH | 830.0555 | | |
| 9 | −1153.954 CC | SPH | | REFL (STOP) | Mirror M |

| S6 ASP | CURV −0.00394531 | K 0 | A (E-10) 6.16733 | B (E-15) 2.87548 | C (E-19) 5.27546 | D (E-24) −4.92086 |
|---|---|---|---|---|---|---|

What is claimed is:

1. An optical system comprising along an optical axis:
   a concave spherical mirror;
   a lens group with positive refracting power arranged adjacent the mirror with an airspace therebetween, the lens group comprising in order farthest from, to closest to, the mirror:
   a plano-convex lens element having a convex surface facing the mirror and a flat surface facing away from the mirror;
   a first negative meniscus lens element adjacent the plano-convex lens and having a convex surface facing the mirror; and
   a second negative meniscus lens element adjacent the first negative meniscus lens and having a convex surface facing the mirror; and
   first and second prisms each having respective first and second flat surfaces, wherein the second flat surfaces are arranged adjacent the flat surface of the plano-convex lens element on opposite sides of the optical axis, and wherein the first flat surfaces are arranged adjacent object and image planes, respectively;
   wherein each lens element in the lens group is formed from a different glass type such that the lens group and first and second prisms provide chromatic aberration correction in a spectral region that contains at least g, h and i-line wavelengths.

2. The optical system of claim 1, having:
   at least one of a square field having a size of at least 61.5 mm×61.5 mm, and a rectangular field having a size of at least 50 mm×100 mm; and
   a numerical aperture of 0.15 or greater.

3. The optical system of claim 1, having a field size of between 50 mm×100 mm and 52.5 mm×100 mm, inclusive.

4. The optical system of claim 1, having a numerical aperture of between 0.16 and 0.20, inclusive.

5. The optical system of claim 1, wherein the lens elements in the lens group are spherical.

6. The optical system of claim 1, in which at least one lens element in the lens group includes an aspherical surface.

7. The optical system of claim 1, in which adjacent surfaces of lens elements in the lens group are in contact one with the other.

8. The optical system of claim 1, in which at least one surface of the lens elements in the lens group is closely air-spaced apart from an adjacent surface of an adjacent lens element.

9. The optical system of claim 1, wherein said first and second prisms are formed with glass type 603606.

10. The optical system of claim 6, wherein the plano-convex lens is formed from one of fused silica and silica glass.

11. The optical system of claim 8, wherein the plano-convex lens is formed from glass type 458678.

12. The optical system of claim 8, wherein the first and second meniscus lens elements are respectively formed from glass type 581408 and glass type 532490.

13. The optical system of claim 1, wherein the first and second prisms are formed with glass type 603606, the plano-convex lens is formed with glass type 458678, and the first and second meniscus lens elements are respectively formed with glass types 581408 and 532490.

14. The optical system of claim 1, wherein the convex surface of the second meniscus lens element is aspherical.

15. The optical system of claim 1, wherein the convex surface of the first meniscus lens element is aspherical.

16. The optical system of claim 1, wherein the first meniscus lens has an aspherical concave surface.

17. The optical system of claim 1, wherein the mirror includes an aperture formed along the optical axis.

18. A projection lithography system comprising: an optical system comprising:

a concave spherical mirror;

a lens group with positive refracting power arranged adjacent the mirror with an airspace therebetween, the lens group comprising in order farthest from to closest to the mirror:

a plano-convex lens element having a convex surface facing the mirror and a flat surface facing away from the mirror; and a first negative meniscus lens element adjacent the plano-convex lens and having a convex surface facing the mirror; and a second negative meniscus lens element adjacent the first negative meniscus lens and having a convex surface facing the mirror; and first and second prisms each having respective first and second flat surfaces, wherein the second flat surfaces are arranged adjacent the flat surface of the plano-convex lens element on opposite sides of the optical axis, and wherein the first flat surfaces are arranged adjacent object and image planes, respectively;

wherein each lens element in the lens group is formed from a different glass type such that the lens group and first and second prisms provide chromatic aberration correction in a spectral region that contains at least g, h and i-line wavelengths;

a mask stage capable of supporting a mask at the object plane;

an illuminator adapted to illuminate the mask with at least one wavelength in a spectral region that contains at least the g-line, h-line and i-line wavelengths; and a wafer stage capable of movably supporting a wafer at the image plane.

19. The system of claim 18, having:

at least one of a square field having a size of 61.5 mm×61.5 mm or greater, and a rectangular field having a size of 50 mm×100 mm or greater; and a numerical aperture 0.15 or greater.

20. The system of claim 18, having a field having a size of between 50 mm×100 mm and 52.5 mm×100 mm, inclusive.

21. The system of claim 18, further including a numerical aperture of between 0.16 and 0.20, inclusive.

* * * * *